United States Patent [19] … [11] Patent Number: 5,218,611
Tanaka et al. … [45] Date of Patent: Jun. 8, 1993

[54] LASER DIODE SYSTEM HAVING AN AIR-TIGHT INTERCONNECTING SOLID STATE WAVE-GUIDE MEANS FOR TRANSMITTING LIGHT

[75] Inventors: Haruo Tanaka; Naofumi Aoki, both of Kyoto, Japan

[73] Assignee: Rohm Co., Ltd., Kyoto, Japan

[21] Appl. No.: 673,591

[22] Filed: Mar. 22, 1991

[30] Foreign Application Priority Data

Mar. 23, 1990 [JP] Japan .................................. 2-74286

[51] Int. Cl.$^5$ .............................................. H01S 3/04
[52] U.S. Cl. ........................................ 372/36; 372/108
[58] Field of Search .................... 372/44, 50, 36, 45, 372/46, 109, 108; 357/19; 257/80, 82

[56] References Cited

U.S. PATENT DOCUMENTS 4,380,862 4/1983 Nyul ........................................ 372/44
4,745,294 5/1988 Kohashi et al. ......................... 357/19
4,790,620 12/1988 Niwayama ............................. 357/19
4,851,695 7/1989 Stein ...................................... 357/19
4,877,756 10/1989 Yamamoto et al. .................... 357/19
4,954,853 9/1990 Yoshida et al. ......................... 357/19
5,016,253 5/1991 Kubota ................................... 357/19

FOREIGN PATENT DOCUMENTS 2-125688 5/1990 Japan ..................................... 372/49

Primary Examiner—James W. Davie

[57] ABSTRACT

A laser diode which includes a substrate, a laser diode chip bonded on the substrate through a sub-mount, and a monitor element formed on the substrate or the sub-mount so as to monitor laser light emitted from a rear cleavage face of the laser diode chip. The rear cleavage face and the surface of the monitor element are connected, through a space between them, by a solid state waveguide device of a light-transmitting or semi-light transmitting nature.

10 Claims, 3 Drawing Sheets

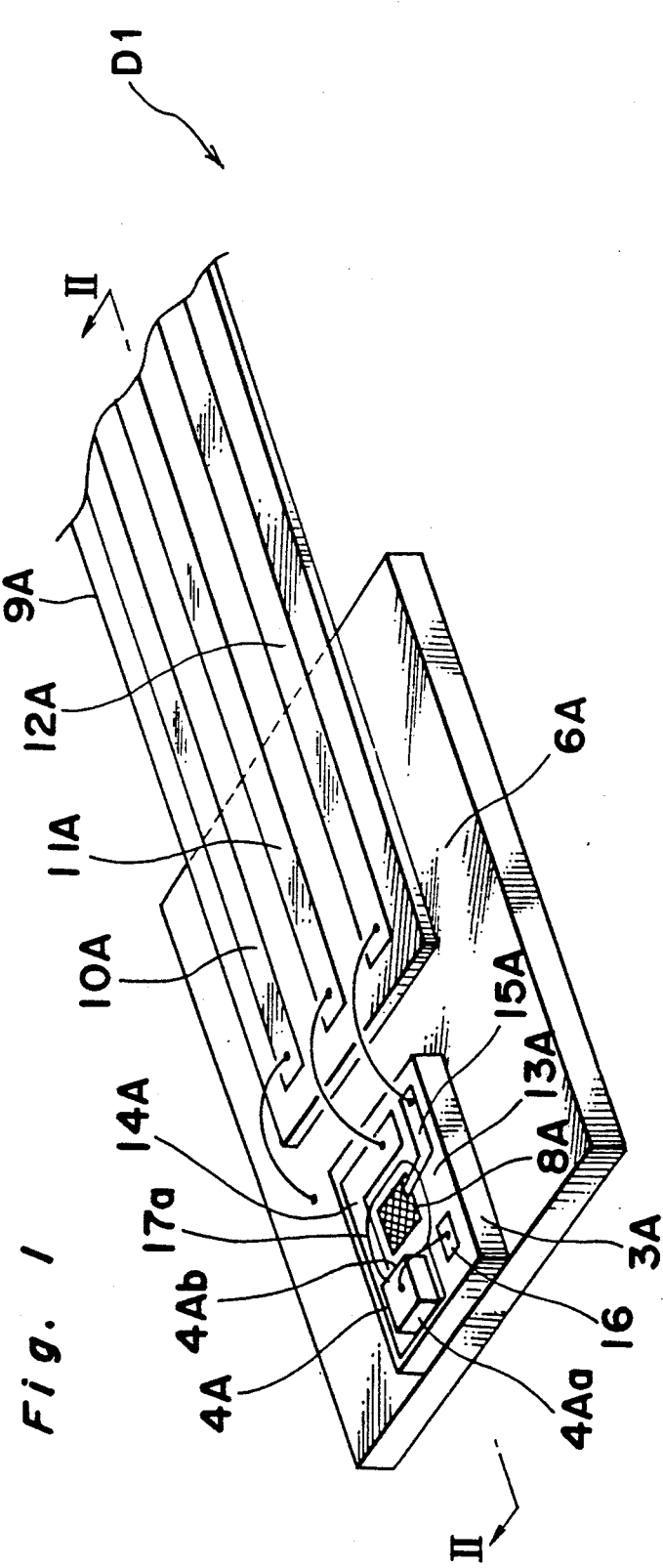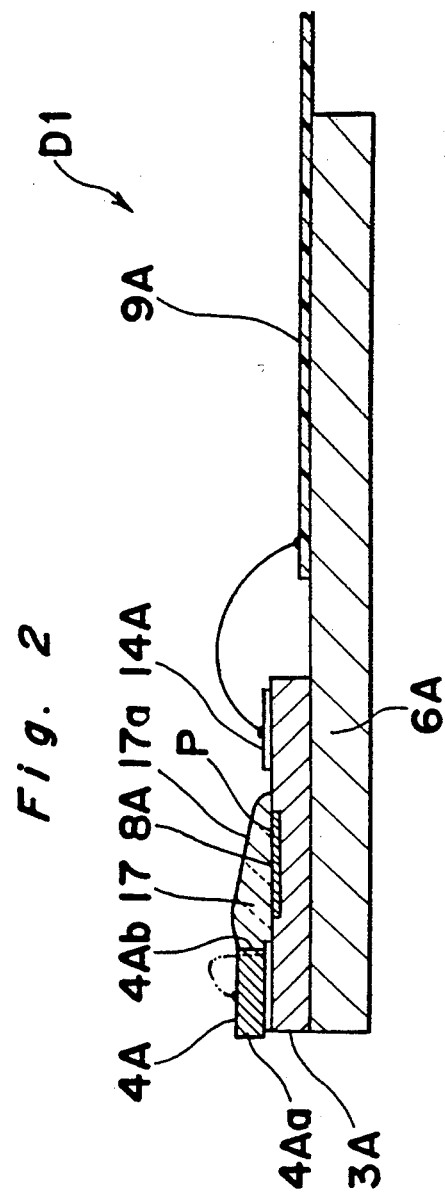

LASER DIODE SYSTEM HAVING AN AIR-TIGHT INTERCONNECTING SOLID STATE WAVE-GUIDE MEANS FOR TRANSMITTING LIGHT

BACKGROUND OF THE INVENTION

The present invention generally relates to a diode unit, and more particularly, to a laser diode for use in electrical or electronic equipment.

Generally, laser diodes are available in a so-called can-seal type, and a unit type. As shown in FIG. 5, the known can-seal type laser diode includes a stem 2 erected on a heat sink 1, a laser diode chip 4 bonded to the stem 2 through a sub-mount 3, a monitor element 8 disposed on the upper surface of the heat sink 1, and a can-seal 5 of a cylindrical shape with a bottom, applied thereover to seal the upper surface of the heat sink 1. Meanwhile, as illustrated in FIG. 6, the conventional unit type laser diode has a laser diode chip 4 bonded onto a substrate 6 through a sub-mount 3 and having two cleavage faces 4a and 4b, a monitor element 8 formed generally at a central portion of the sub-mount 3, a wiring 14 for supplying power to the laser diode chip 4, another wiring 15 for deriving electric current, formed on the sub-mount 3, through functioning of the monitor element 8, and a flexible circuit 9 connected adjacent to one edge of the substrate 6, with leads 10,11, and 12 being connected to the substrate 6 and wirings 14 and 15 as shown.

In any of the above known two types of laser diodes, it is so arranged to monitor the laser light emitted from one cleavage face by the monitor element 8, thereby to control light output of the laser diode chip 4 so that intensity of the laser light thus monitored reaches a desired level.

More specifically, in the can-seal type laser diode in FIG. 5 as described above, a photo-diode as the monitor element 8 is disposed on the heat-sink 1 so as to receive the laser light directed from the cleavage face at the lower portion of the diode chip 4, while in the unit type laser diode in FIG. 6, the photo-diode 8 for the monitor element is integrally formed on the sub-mount 3 of a silicon material.

In the construction for monitoring the laser output in the conventional laser diodes as described so far, since it is so arranged to receive the laser light emitted from one of the cleavage faces of the laser diode chip by the monitor element through a space therebetween, problems can occur hereinafter described.

Firstly, with respect to the can-seal type laser diode referred to above, modification thereof into an open type without the can-seal 5 may be considered for the requirement of size reduction in an appliance in which the laser diode is to be incorporated. In such a case, it is assumed that the surface of the monitor element 8 is covered by dew formation, dust or the like, and consequently, the laser output as monitor information becomes low in level to apply a high level drive to the laser diode chip 4, thus resulting in breakage of said laser diode chip.

Furthermore, also with respect to the unit type laser diode as described above, if it is formed into an open type, the problem for the faulty monitoring arising from dew formation, dust, etc. and/or problems related to the breakage of the laser diode 4 are also expected. Moreover, particularly in this unit type laser diode, there is such a fundamental problem that, since an incidence angle of the laser light onto the surface of the monitor element 8 (i.e. an angle between an optical axis of the laser light and the surface of the monitor element) is small, the monitor element 8 can not receive a sufficient amount of laser light.

SUMMARY OF THE INVENTION

Accordingly, an essential object of the present invention is to provide a laser diode which is capable of accurately monitoring laser light from a laser diode chip by a monitor element without being affected at all by dew formation, dust or the like, even in the case where the laser diode is formed into an open type, and also, capable of permitting a sufficient amount of laser light to reach the surface of the monitor element, even when an angle between an optical axis of the laser light from the laser diode chip and the surface of the monitor element is small.

Another object of the present invention is to provide a laser diode of the above described type, which is simple in construction and stable in functioning at high reliability, and can be readily manufactured on a large scale at low cost.

In accomplishing these and other objects, according to one preferred embodiment of the present invention, there is provided a laser diode which includes a substrate, a laser diode chip bonded on said substrate through a sub-mount, and a monitor element formed on said substrate or said sub-mount so as to monitor laser light emitted from a rear cleavage face of said laser diode chip. The rear cleavage face and the surface of said monitor element are connected, through a space therebetween, by a solid state wave-guide means of a light-transmitting or semi-light transmitting nature.

The above solid state waveguide means may be readily formed, for example, by covering the space between said rear cleavage face and the surface of said monitor element by light-transmitting or semi-light transmitting resin.

The resin as referred to above may be that dispersed with a light scattering agent or a resin having a light scattering nature in itself.

In the arrangement according to the present invention as described above, the laser light emitted from the rear cleavage face of the laser diode chip during functioning of the laser diode does not reach the monitor element through the space as in the conventional laser diodes, but it arrives at the monitor element through the solid state waveguide means. Since such solid state waveguide means is formed by a solid substance of resin or the like, it is free from undesirable dew formation or entry of dust, etc., while there is no possibility of lowering with time, the laser light guiding performance from the laser diode chip to the monitor element.

BRIEF DESCRIPTION OF THE DRAWING

These and other objects and features of the present invention will become apparent from the following description taken in conjunction with the preferred embodiment thereof with reference to the accompanying drawings, in which;

FIG. 1 is a perspective view of a laser diode D1 of a unit type according to one preferred embodiment of the present invention, FIG. 2 is a cross section taken along the line II—II in FIG. 1.

DETAILED DESCRIPTION OF THE INVENTION

Figure 3:
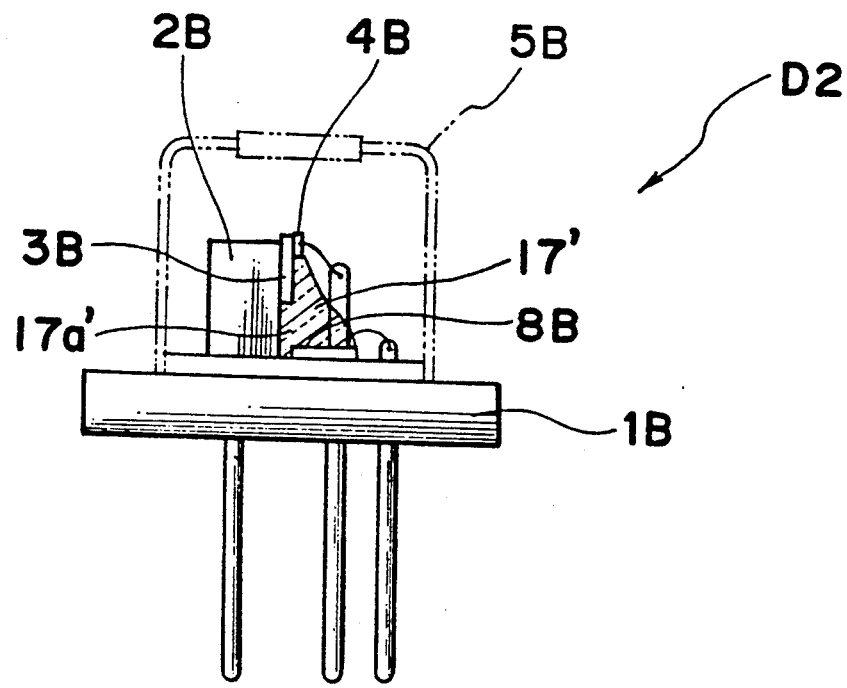
FIG. 3 is a side elevational view partly in section, showing a laser diode D2 of a can-seal type according to another embodiment of the present invention.

Before the description of the present invention proceeds, it is to be noted that like parts are designated by like reference numerals throughout the accompanying drawings.

Referring now to the drawings, there is shown in FIGS. 1 and 2, a unit type laser diode D1 according to one preferred embodiment of the present invention.

In the first place, it is to be noted that the unit type laser diode D1 has the construction generally similar to that as referred to earlier in the conventional unit type laser diode in FIG. 6, but is particularly characterized in that a solid state waveguide means 17 of a resin material is applied into a space between a rear cleavage face 4Ab of a laser diode chip 4A and the surface of a monitor element 8A as explained hereinafter, with like parts in FIG. 6 being designated by like reference numerals for quick reference.

As shown in FIGS. 1 and 2, the unit type laser diode D1 generally includes a sub-mount 3A bonded with the laser diode chip 4A and fixedly mounted on a substrate 6A, and a flexible circuit 9A connected adjacent to one edge on the substrate 6A, with leads 10A,11A and 12A on the flexible circuit 9A being connected with constitutional elements for the laser diode D1 as described in detail hereinafter.

The substrate 6A is prepared by applying nickel plating and gold plating on a surface of an aluminum plate, and the sub-mount 3A as referred to above is disposed at a forward central portion on the surface of said substrate 6A and fixed thereon by a connecting material such as indium or the like. The sub-mount 3A basically made of a rectangular plate of a silicon material is formed, on its surface through a silicon dioxide film 13A, with an aluminum wiring 14A for feeding power to the laser diode chip 4A, and another aluminum wiring 15A for taking out electric current generated on the sub-mount 3A by the function of the monitor element 8A to be described more in detail later.

At the forward central portion on the sub-mount 3A, the aluminum wiring 14A extends to form a bonding surface, on which the laser diode chip 4A is bonded by an electrically conductive brazing material. In this case, two cleavage faces 4Aa and 4Ab of the laser diode chip 4A are disposed to be directed in forward and backward directions of the sub-mount 3A, respectively.

Meanwhile, at the central portion on the surface of the sub-mount 3A, i.e. at a region adjacent to the rear cleavage face 4Ab of the laser diode chip 4A, a photodiode element, which functions as the monitor element 8A, is integrally constituted by forming a PN junction through diffusion of a P type impurity P from the surface. The P type impurity P is associated with the aluminum wiring 15A.

The aluminum wirings 14A and 15A are respectively connected to the corresponding leads 11A and 12A on the flexible circuit 9A by wire bonding, while a negative electrode of said laser diode chip 4A is wire-bonded to a pad 16 conducted inside by partly cutting open the silicon dioxide film 13a on the sub-mount 3A and is thus conducted to the predetermined lead 10A on the flexible circuit 9A through the conductive plated portion on the substrate 6A, and the wire bonding thereof with respect to the flexible circuit 9A. Although not particularly shown, the sub-mount 3A and laser diode chip 4A are further covered by a transparent protective film.

When a predetermined voltage is impressed across the leads 10A and 11A, the laser diode chip 4a emits laser light from both cleavage faces 4Aa and 4Ab, and the monitor element 8A receives the laser light from the rear cleavage face 4Ab, thereby to generate electric current corresponding to the intensity thereof. According to the monitor information for the laser light intensity of the laser diode chip 4A obtained by monitoring said electric current value, the optical output of the laser diode chip 4A may be subjected to feed-back control.

In the arrangement as described so far, the laser diode D1 according to the present invention is characterized in that the light-transmitting or semi-light transmitting solid state waveguide means 17 is applied in a space between the rear cleavage face 4Ab of the laser diode chip 4A and the surface of the monitor element 8A for connection therebetween.

The provision of such solid state waveguide means 17 may be readily effected by simply applying a resin material in a liquid state, e.g. silicon resin or epoxy resin 17a so as to cover both the rear cleavage face 4Ab and the surface of the monitor element 8A for subsequent hardening. In the case where a silicon resin is to be employed, such a silicon resin material should preferably be comparatively soft and capable of elastic deformation even after hardening, but it is differentiated from a gas or liquid having a fluidity at normal temperature from the viewpoint of preventing entry of dust or the like into the interior, thus classified as a solid as referred to above.

By the above structure, most of the laser light emitted from the rear cleavage face 4Ab of the laser diode chip 4A is to reach the surface of the monitor element 8A through said resin 17a, because a greater part of the laser light passing through the resin 17a and reaching the surface of the monitor element 8A is subjected to total reflection without being transmitted outside due to difference in the refractive indices, so as to be returned into the resin, thus arriving at the surface of the monitor element 8A.

Moreover, when a scattering agent such as fine particles of aluminum oxide or the like is mixed in the above resin for dispersion or the resin itself is rendered to be semi-transparent for light scattering, the laser light is subjected to irregular reflection within the resin, thus making it possible for the monitor element 8A to receive uniform laser light on the whole surface area. This may be related to the capability of more accurate control for the output of the laser diode chip by increasing the laser light amount received by the monitor element 8 for consequent increase of the monitor current.

It should be noted here that, in the foregoing embodiment, although the present invention has been described as applied to the laser diode of the unit type, the concept of the present invention is not limited, in its application, to such unit type laser diode alone, but may be readily applied to any laser diode of the type in which the laser light from the rear cleavage face of the laser diode chip is to be monitored by the monitor element.

Figure 4:
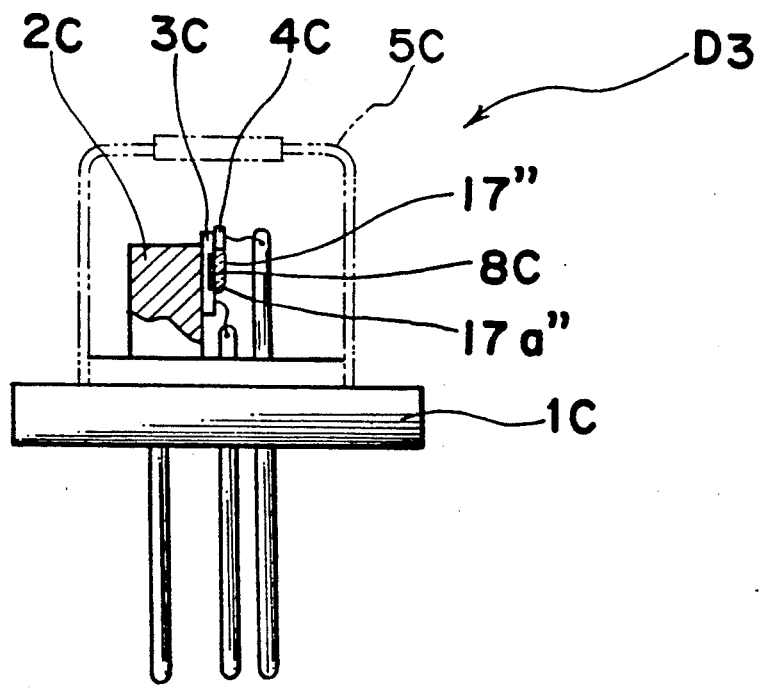
FIG. 4 is a view similar to FIG. 3, which particularly shows a laser diode D3 according to a further embodiment thereof.
Figures 5, 6:
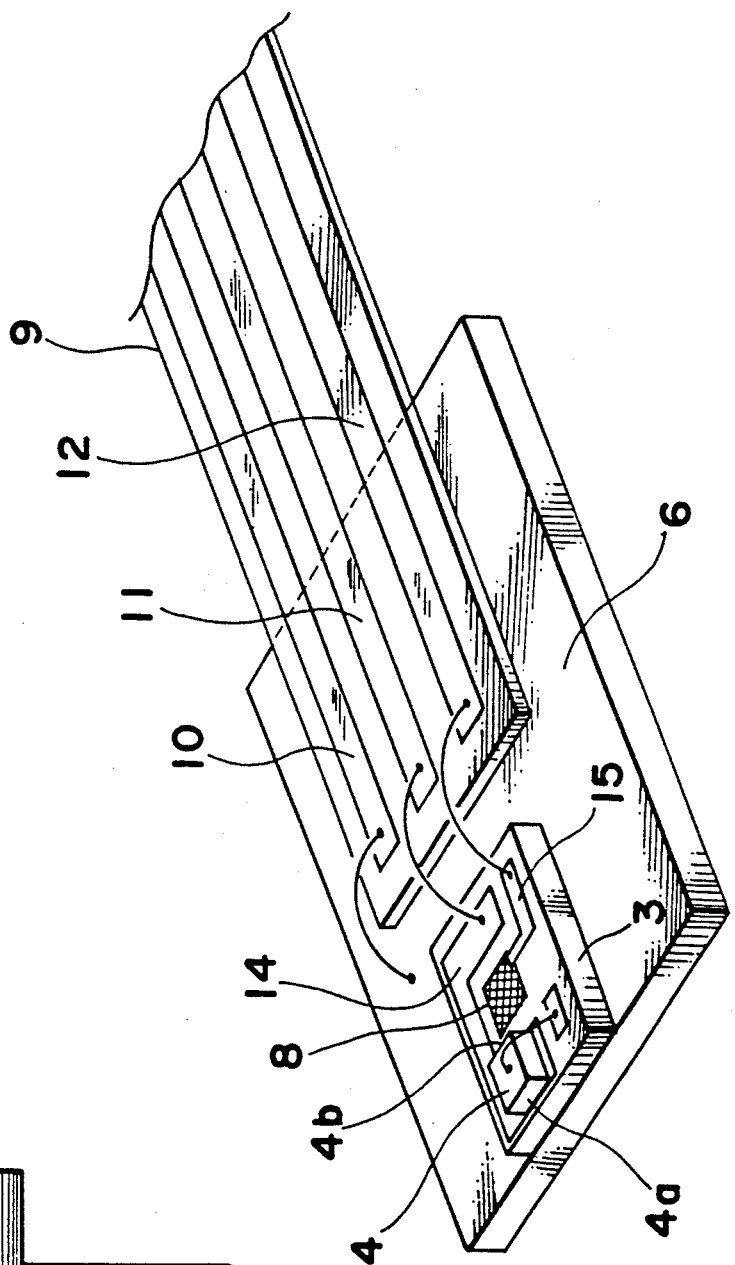
FIG. 5 is a side elevational view partly in section showing a conventional laser diode of a can-seal type.
FIG. 6 is a perspective view of a conventional laser diode of a unit type.

FIGS. 3 and 4 show further embodiments, in which the present invention is applied to the laser diodes having the fundamental structure of the can-seal type as referred to earlier in the conventional arrangement of FIG. 5.

The laser diode D2 of a can-seal type for the embodiment of FIG. 3 includes a stem 2B erected on a heat sink 1B, a laser diode chip 4B bonded to the stem 2B through a sub-mount 3B, a monitor element 8B disposed on the upper surface of the heat sink 1B separately from the sub-mount 3B, and a solid state resin 17a' applied to fill the space between a rear cleavage face of the laser diode chip 4B and the surface of the monitor element 8B so as to form a solid state waveguide means 17' directly related to the present invention, with a can-seal 5B applied over the heat sink 1B for sealing as in the conventional laser diode described earlier in FIG. 5.

Meanwhile, in the laser diode D3 for the embodiment of FIG. 4, the monitor element 8C is integrally formed on the sub-mount 3C which is fixed to the stem 2C and to which the laser diode chip 4C is bonded, instead of being directly mounted on the heat sink 1C as in the arrangement of FIG. 3. In this case also, a solid state resin 17a'' is applied to fill the space between the rear cleavage face of the laser diode chip 4C and the surface of the monitor element 8C so as to form a solid state waveguide means 17'', with a can-seal 5C applied over the heat sink 1C for sealing in the similar manner.

In each of the above embodiments of FIGS. 3 and 4, it becomes also possible to achieve more accurate monitoring of the laser light from the laser diode chip by the monitor element owing to the provision of the solid state waveguide means according to the present invention.

As is clear from the foregoing description, according to the laser diode of the present invention, since the space between the rear cleavage face of the laser diode chip and the surface of the monitor element is connected by the solid state waveguide means, the laser diode is not affected by dew formation or dust adhesion so as to positively monitor the laser light from the laser diode chip by the monitor element, whereby the undesirable monitoring faults and/or breakage of the laser diode chip due to dew formation or dust adhesion as in the conventional arrangements may be advantageously prevented. Furthermore, since the amount of laser light received by the monitor element is increased as compared with that in the known laser diodes to produce a sufficient amount of monitor current, still more accurate feed back control of the laser diode chip output becomes possible, particularly in the unit type laser diode in which the angle between the optical axis of the laser light from the rear cleavage face and the surface of the monitor element is small.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A laser diode system which comprises a substrate, a laser diode chip bonded on said substrate through a sub-mount, said chip having a rear cleavage face, a monitor element disposed on said substrate through said sub-mount and having a surface to receive and to monitor laser light emitted from said rear cleavage face, and a solid state waveguide means of a light-transmitting or semi-light transmitting nature, said waveguide means being interposed to communicatingly extend from said surface of said monitor element to said rear cleavage face, said waveguide means being a resin in a liquid state when applied between said rear cleavage face and said surface of said monitor element for hardening, thereby to form a solid state waveguide means having air-tightness.

2. The laser diode system as claimed in claim 1, wherein said resin is of a transparent resin material.

3. The laser diode system as claimed in claim 1, wherein said resin is dispersed with a light scattering agent, said light scattering agent subjecting the laser light emitted from said rear cleavage face to irregular reflection so as to be introduced into the monitor light.

4. The laser diode system as claimed in claim 1, wherein said resin is of a semi-transparent resin material having light-scattering properties.

5. The laser diode system as claimed in claim 1, wherein said rear cleavage face is disposed facing toward said monitor element.

6. A laser diode system which comprises a substrate, a laser diode chip bonded on said substrate through a sub-mount, said chip having a rear cleavage face, a monitor element disposed on said sub-mount and having a surface to receive and to monitor laser light emitted from said rear cleavage face, and a solid state waveguide means of a light-transmitting or semi-light transmitting nature, said waveguide means being interposed to communicatingly extend from said surface of said monitor element to said rear cleavage face, said waveguide means being a resin in a liquid state when applied between the rear cleavage face and said surface of said monitor element for hardening, thereby to form a solid state waveguide means having air-tightness.

7. The laser diode system as claimed in claim 6, wherein said resin is of a transparent resin material.

8. The laser diode system as claimed in claim 6, wherein said resin is dispersed with a light scattering agent, said light scattering agent subjecting the laser light emitted from said rear cleavage face to irregular reflection so as to be introduced into the monitor light.

9. The laser diode system as claimed in claim 6, wherein said resin is of a semi-transparent resin material having light-scattering properties.

10. The laser diode system as claimed in claim 6, wherein said rear cleavage face is disposed facing toward said monitor element.

* * * * *